(12) United States Patent
Muraki et al.

(10) Patent No.: US 10,096,486 B2
(45) Date of Patent: Oct. 9, 2018

(54) SUBSTRATE PROCESSING APPARATUS, SUBSTRATE PROCESSING METHOD AND SUBSTRATE PROCESSING LIQUID

(71) Applicant: Toshiba Memory Corporation, Tokyo (JP)

(72) Inventors: Shinsuke Muraki, Yokkaichi (JP); Katsuhiro Sato, Yokkaichi (JP); Hiroaki Yamada, Yokkaichi (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/264,960

(22) Filed: Sep. 14, 2016

(65) Prior Publication Data

US 2017/0221725 A1    Aug. 3, 2017

(30) Foreign Application Priority Data

Feb. 2, 2016   (JP) .................. 2016-018162

(51) Int. Cl.
*H01L 21/461*    (2006.01)
*H01L 21/3213*   (2006.01)
(Continued)

(52) U.S. Cl.
CPC .......... *H01L 21/32134* (2013.01); *C23F 1/14* (2013.01); *C23F 1/16* (2013.01); *C23F 1/18* (2013.01); *H01L 21/67086* (2013.01)

(58) Field of Classification Search
CPC ...... C23F 1/16; C23F 1/14; C23F 1/20; C23F 1/26; C23F 1/34; C23F 1/44; H01L 21/32134; H01L 21/32135; H01L 21/67086; H01L 21/3212; H01L 29/66795; H01L 21/0214; H01L 21/02164;
(Continued)

(56) References Cited

U.S. PATENT DOCUMENTS 4,543,320 A * 9/1985 Vijan ................ H01L 21/3085
                                              252/79.4
7,635,436 B2   12/2009 Kim et al.
(Continued)

FOREIGN PATENT DOCUMENTS

JP        6-104241      4/1994
JP        2003-13261    1/2003
(Continued)

*Primary Examiner* — Lan Vinh
(74) *Attorney, Agent, or Firm* — Oblon, McClelland, Maier & Neustadt, L.L.P.

(57) ABSTRACT

In one embodiment, a substrate processing liquid contains phosphoric acid as a primary component and contains water and ketone. In another embodiment, a substrate processing method includes processing a substrate in a substrate processing bath with a substrate processing liquid containing phosphoric acid, water and ketone. The method further includes discharging the substrate processing liquid from the substrate processing bath to a circulating flow channel, heating the substrate processing liquid flowing through the circulating flow channel at a temperature between 50° C. and 90° C., and supplying the substrate processing liquid again from the circulating flow channel to the substrate processing bath to circulate the substrate processing liquid under heating.

7 Claims, 7 Drawing Sheets

(51) Int. Cl.
  *C23F 1/16* (2006.01)
  *H01L 21/67* (2006.01)
  *C23F 1/14* (2006.01)
  *C23F 1/18* (2006.01)
(58) Field of Classification Search
  CPC ......... H01L 21/02167; H01L 21/31053; H01L 21/02074; H01L 21/283; H01L 21/32055
  USPC ..... 252/79.1, 79.2, 79.3; 438/745, 750, 752, 438/693, 694; 134/1.3, 3; 156/345.1, 156/345.11, 345.18
  See application file for complete search history.

(56) References Cited

U.S. PATENT DOCUMENTS

| | | | |
|---|---|---|---|
| 7,846,262 B2* | 12/2010 | Gray | B08B 3/102 134/21 |
| 8,262,928 B2 | 9/2012 | Kim et al. | |
| 2004/0242000 A1 | 12/2004 | Jo et al. | |
| 2007/0178706 A1 | 8/2007 | Kim et al. | |
| 2008/0067148 A1 | 3/2008 | Liu et al. | |
| 2009/0270300 A1* | 10/2009 | Uehara | C11D 7/08 510/175 |
| 2012/0031872 A1* | 2/2012 | Sekiguchi | B82Y 10/00 216/13 |
| 2015/0152328 A1* | 6/2015 | Nakanowatari | C09K 13/06 216/13 |
| 2015/0267305 A1 | 9/2015 | Choi et al. | |

FOREIGN PATENT DOCUMENTS

| | | |
|---|---|---|
| JP | 2004-158746 | 6/2004 |
| JP | 2005-29869 | 2/2005 |
| JP | 2005-163070 | 6/2005 |
| JP | 2006-229216 | 8/2006 |
| JP | 2006-339635 | 12/2006 |
| JP | 2008-266748 | 11/2008 |
| JP | 2009-206488 | 9/2009 |
| JP | 2010-265547 | 11/2010 |
| JP | 2012-49535 | 3/2012 |
| JP | 2012-253226 | 12/2012 |
| JP | 2015-185840 | 10/2015 |

* cited by examiner

|  | $H_3PO_4$ (wt%) | $CH_3COOH$ (wt%) | $HNO_3$ (wt%) | $H_2O$ (wt%) |
|---|---|---|---|---|
| IMMEDIATELY AFTER LIQUID EXCHANGE | 70.6 | 10.1 | 2.14 | 17.2 |
| AFTER 24 HOURS CIRCULATION | 78.4 | 6.62 | 0.67 | 14.4 |
| AFTER 24 HOURS CIRCULATION (WATER SUPPLEMENT) | 71.6 | 5.03 | 1.22 | 22.1 |

FIG. 3

|  | R-COOH | | | | R1-CO-R2 | | | | |
|---|---|---|---|---|---|---|---|---|---|
|  | ACETIC ACID | PROPIONIC ACID | BUTYRIC ACID | i-BUTYRIC ACID | ETHYL METHYL KETONE | DIETHYL KETONE | PROPYL METHYL KETONE | t-BUTYL METHYL KETONE | i-BUTYL METHYL KETONE | t-BUTYL METHYL KETONE |
| VAPOR PRESSURE (mmHg) 20°C | 11.25 | 2.4 | 0.43 | 1.5 | 78.75 | 28.2 | 12 | 31.5 | 15.75 | 2.7 |
| VISCOSITY (cP) 20°C | 1.22 | | 1.4 | | 0.4 | 0.47 | 0.5 | 0.542 | 0.61 | 0.84 |
| WATER SOLUBILITY | COMPATIBLE | 34g/L | 56g/L | 210g/L | 223g/L | LITTLE | 4% | 2.44% | 19g/L | 4.3g/L |
| BOILING POINT(°C) | 118 | 141 | 164 | 154 | 80 | 102 | 102 | 105 | 117 | 147 |

FIG. 4

| | R1 | | | | | | | |
|---|---|---|---|---|---|---|---|---|
| R2 | METHYL | ETHYL | PROPYL | i-PROPYL | BUTYL | i-BUTYL | t-BUTYL | PENTYL |
| METHYL | ✕ | ✕ | ✕ | ✕ | ✕ | ✕ | ✕ | ✕ |
| ETHYL | 10.5kPa 0.4cP | 2.0kPa 0.48cP | ✕ | ✕ | ✕ | ✕ | ✕ | ✕ |
| PROPYL | 1.3kPa 0.5cP | | 0.7kPa 0.74cP 3.2g/L | ✕ | ✕ | ✕ | ✕ | ✕ |
| i-PROPYL | 5.5kPa 0.48cP 6g/L | | | ✕ | ✕ | ✕ | ✕ | ✕ |
| BUTYL | 0.36kPa 0.84cP 4.3g/L | 0.19kPa 0.84cP 4.3g/L | | | ✕ | ✕ | ✕ | ✕ |
| i-BUTYL | 2.1kPa 0.55cP 19g/L | | | | | ✕ | ✕ | ✕ |
| t-BUTYL | 4.2kPa 0.54cP | | | | | | ✕ | ✕ |
| PENTYL | 0.1kPa 0.77cP 4.3g/L | | | | | | | 0.0067kPa 0.05g/L |

SUBSTRATE PROCESSING APPARATUS, SUBSTRATE PROCESSING METHOD AND SUBSTRATE PROCESSING LIQUID

CROSS REFERENCE TO RELATED APPLICATION

This application is based upon and claims the benefit of priority from the prior Japanese Patent Application No. 2016-18162, filed on Feb. 2, 2016, the entire contents of which are incorporated herein by reference.

FIELD

Embodiments described herein relate to a substrate processing apparatus, a substrate processing method and a substrate processing liquid.

BACKGROUND

When a conductive layer of a semiconductor device is recessed, batch wet etching may be performed with mixed acid that contains phosphoric acid, acetic acid and nitric acid. However, it is difficult to circulate the mixed acid even if it is heated at high temperature since the viscosity of phosphoric acid is high. Therefore, the acetic acid is added in the mixed acid to reduce the viscosity of the mixed acid. However, when the mixed acid is heated at high temperature to be circulated, the acetic acid is evaporated from the mixed acid during the circulation of the mixed acid. As a result, the viscosity of the mixed acid increases, which causes problems that in-plane uniformity of a recess amount of the conductive layer deteriorates and a circulating flow rate error of the mixed acid is liable to arise.

BRIEF DESCRIPTION OF THE DRAWINGS

FIG. 3 is a table for explaining concentration change of the substrate processing liquid with time in the comparative example of the first embodiment;

FIG. 4 is a table for explaining the substrate processing liquids of the first embodiment and the comparative example thereof;

FIG. 6 is a table for explaining ketone in the substrate processing liquid of the first embodiment.

DETAILED DESCRIPTION

Embodiments will now be explained with reference to the accompanying drawings.

In one embodiment, a substrate processing liquid contains phosphoric acid as a primary component and contains water and ketone.

(First Embodiment)

Figure 1:
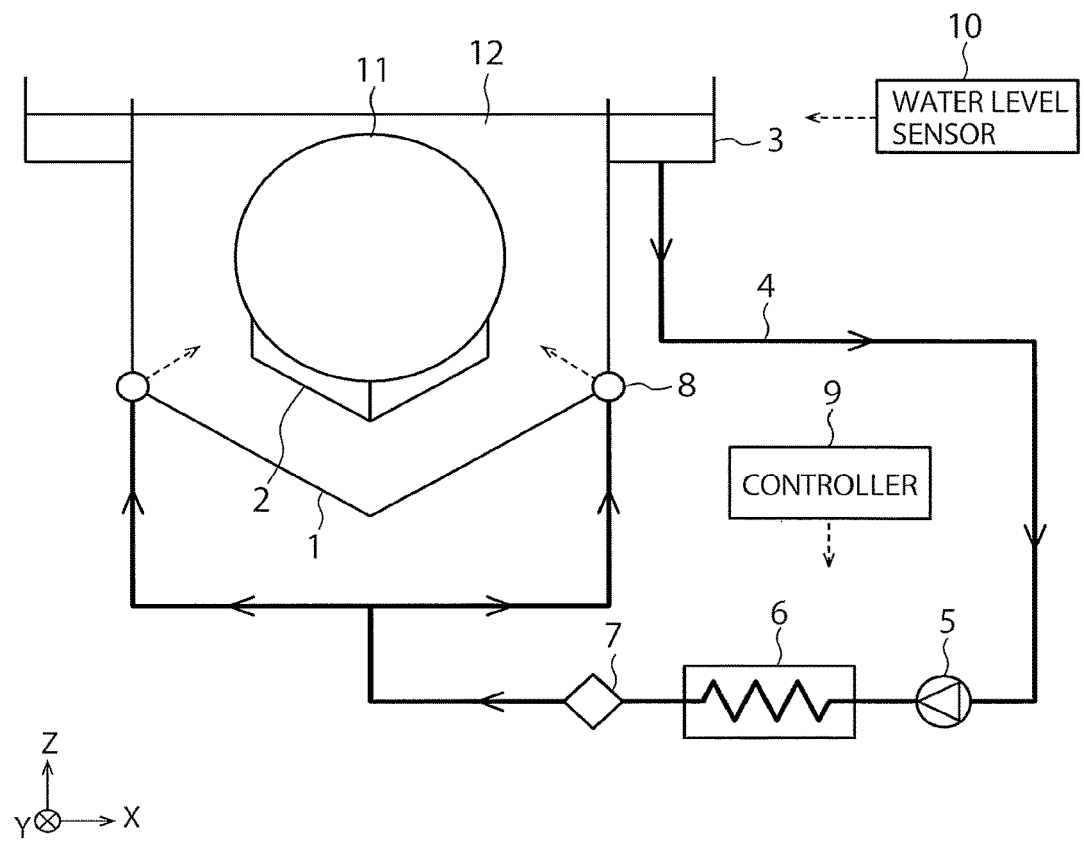
FIG. 1 is a cross-sectional view schematically illustrating a configuration of a substrate processing apparatus of a first embodiment.

FIG. 1 is a cross-sectional view schematically illustrating a configuration of a substrate processing apparatus of a first embodiment.

The substrate processing apparatus in FIG. 1 includes a substrate processing bath 1, a substrate retainer 2, an overflow module 3, a circulating flow channel 4, a pump 5, a heater 6, a purifying module 7, supplying ports 8, a controller 9 and a water level sensor 10. The substrate processing apparatus in FIG. 1 is a batch processing apparatus that processes a plurality of substrates (wafers) 11 with a substrate processing liquid 12. The substrate processing liquid 12 of the present embodiment is an etching liquid that contains phosphoric acid as a primary component and further contains ketone, nitric acid and water. The substrate processing liquid 12 of the present embodiment is used for etching a conductive layer of the substrate 11 by wet etching processing. The substrate processing liquid 12 of the present embodiment contains the ketone as a viscosity adjusting agent and the nitric acid as an oxidizing agent.

The substrate processing bath 1 contains the plurality of substrates 11 and the substrate processing liquid 12. In the present embodiment, these substrates 11 are processed with the substrate processing liquid 12 by immersing these substrates 11 in the substrate processing liquid 12 in the substrate processing bath 1.

The substrate retainer 2 retains the plurality of substrates 11 in the substrate processing bath 1. FIG. 1 illustrates an X-direction and a Y-direction that are substantially parallel to an installation plane of the substrate processing apparatus and perpendicular to each other, and a Z-direction substantially perpendicular to the installation plane of the substrate processing apparatus. These substrates 11 are retained such that a front face and a rear face of each substrate 11 are perpendicular to the Y-direction. In the present specification, the +Z-direction is regarded as the upward direction and the −Z-direction is regarded as the downward direction. The −Z-direction may coincide with the direction of gravity or may not coincide with the direction of gravity.

The substrate processing liquid 12 overflowing the substrate processing bath 1 is pooled in the overflow module 3 and discharged from the overflow module 3 to the circulating flow channel 4. The pump 5, the heater 6 and the purifying module 7 are provided on the circulating flow channel 4 in series. The pump 5 transfers the substrate processing liquid 12 via the circulating flow channel 4. The heater 6 heats the substrate processing liquid 12 flowing through the circulating flow channel 4. The purifying module 7 purifies the substrate processing liquid 12 flowing through the circulating flow channel 4 with a filter or the like. The substrate processing liquid 12 having passed through the pump 5, the heater 6 and the purifying module 7 is supplied again to the substrate processing bath 1 from the circulating flow channel 4 via the supplying ports 8. In this way, the substrate processing liquid 12 is circulated between the substrate processing bath 1 and the circulating flow channel 4.

The controller 9 controls operation of the substrate processing apparatus. For example, the controller 9 controls the pump 5 to control a flow and a flow rate of the substrate processing liquid 12. Moreover, the controller 9 controls operation of the heater 6 to control a temperature of the substrate processing liquid 12. Moreover, the controller 9 has a function of stopping operation of the substrate processing apparatus in response to a water level falling signal from the water level sensor 10 that monitors a water level in the overflow module 3.

A circulating flow rate "Q" of the substrate processing liquid 12 flowing through the circulating flow channel 4 is represented by the following expression (1) from the Hagen-Poiseuille equation.

$$Q = \pi d^4 \Delta P / 128 \, \mu L \qquad (1)$$

Here, "π" denotes the circular constant, "d" denotes a diameter of the circulating flow channel 4, "ΔP" denotes a pressure difference between both ends of the circulating flow channel 4, "μ" denotes viscosity of the substrate processing liquid 12, and "L" denotes a length of the circulating flow channel 4.

According to the expression (1), when the viscosity "μ" of the substrate processing liquid 12 is large, the circulating flow rate "Q" is small. In this case, there is a possibility that the water level in the overflow module 3 falls and the controller 9 stops the substrate processing apparatus in response to the water level falling signal from the water level sensor 14. Therefore, the viscosity "μ" of the substrate processing liquid 12 is desirable to be small.

Figure 2A:
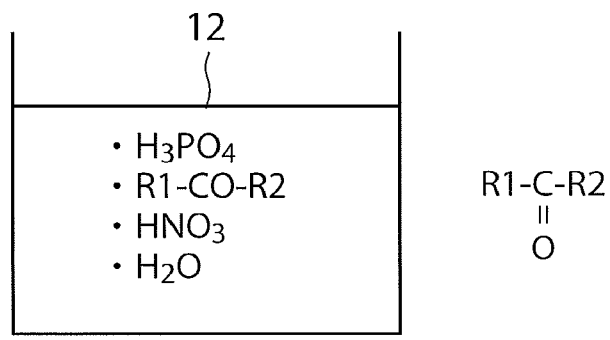
FIGS. 2A and 2B are diagrams for explaining components in substrate processing liquids of the first embodiment and a comparative example thereof.
Figure 2B:
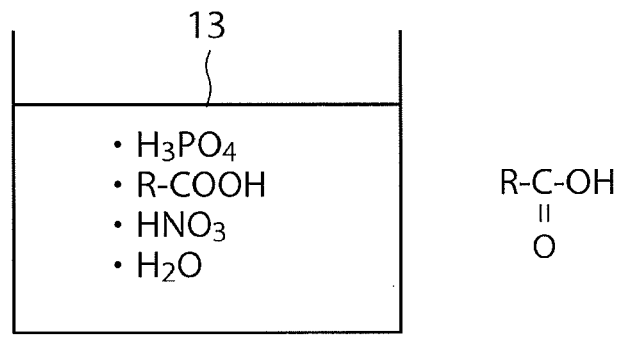

FIGS. 2A and 2B are diagrams for explaining components in the substrate processing liquids 12 and 13 of the first embodiment and a comparative example thereof.

FIG. 2A illustrates components in the substrate processing liquid 12 of the first embodiment. The substrate processing liquid 12 of the present embodiment contains phosphoric acid ($H_3PO_4$), ketone (R1—CO—R2), nitric acid ($HNO_3$) and water ($H_2O$). R1 and R2 mentioned above designate hydrocarbon groups. The structural formula of the ketone is illustrated on the right side of FIG. 2A. R1 and R2 mentioned above may be hydrocarbon derivative groups.

FIG. 2B illustrates components in the substrate processing liquid 13 of the comparative example of the first embodiment. The substrate processing liquid 13 of the present comparative example contains phosphoric acid ($H_3PO_4$), carboxylic acid (R—COOH), nitric acid ($HNO_3$) and water ($H_2O$). R mentioned above designates a hydrocarbon group. The structural formula of the carboxylic acid is illustrated on the right side of FIG. 2B. The carboxylic acid of the present comparative example is acetic acid ($CH_3COOH$). R mentioned above may be a hydrocarbon derivative group.

In the present comparative example, the viscosity of the substrate processing liquid 13 is reduced by adding the acetic acid in the substrate processing liquid 13. However, in the case where the substrate processing liquid 13 is used for the substrate processing apparatus, when the substrate processing liquid 13 is heated at a high temperature by the heater 6 to be circulated, the acetic acid is evaporated from the substrate processing liquid 13 during the circulation of the substrate processing liquid 13. As a result, the viscosity of the substrate processing liquid 13 increases.

On the other hand, in the present embodiment, the viscosity of the substrate processing liquid 12 is reduced by adding the ketone in the substrate processing liquid 12. In this case, when low-volatile ketone is used, the ketone can be suppressed from being evaporated from the substrate processing liquid 12 during circulation of the substrate processing liquid 12 even when the substrate processing liquid 12 is heated at a high temperature by the heater 6 to be circulated. Therefore, according to the present embodiment, viscosity change of the substrate processing liquid 12 with time can be suppressed.

The heater 6 of the present embodiment is desirable to heat the substrate processing liquid 12 at a temperature between 50° C. and 90° C. The reason is that a temperature of 50° C. or more is desirable with efficiency of processing of the substrates 11 taken into consideration and that a temperature of 90° C. or less is desirable with suppressing an evaporation rate of the water from the substrate processing liquid 12 taken into consideration.

The substrate processing liquid 12 of the present embodiment contains phosphoric acid having 50 to 95 wt % of concentration, ketone (viscosity adjusting agent) having 0.5 to 15 wt % of concentration, nitric acid (oxidizing agent) having 0.1 to 10 wt % of concentration, and water having 4 to 49.5 wt % of concentration. It is desirable that the ketone of the present embodiment is liquid at 20° C., has vapor pressure of 30 mmHg or less at 20° C., and has viscosity of 1.0 cP or less at 20° C. Namely, the ketone of the present embodiment is desirable to have low viscosity and is desirable to have low vapor pressure to be difficult to be evaporated. Specific examples of such ketone are mentioned later.

The substrate processing liquid 12 of the present embodiment may contain an oxidizing agent other than nitric acid. Examples of such an oxidizing agent are hydrogen peroxide ($H_2O_2$) and ozone ($O_3$). Moreover, the substrate processing liquid 12 of the present embodiment may contain a viscosity adjusting agent other than ketone in order to adjust the viscosity of the substrate processing liquid 12. Such a viscosity adjusting agent is desirable to be liquid at 20° C., to have vapor pressure of 30 mmHg or less at 20° C., and to have viscosity of 1.0 cP or less at 20° C. This enables the viscosity of the substrate processing liquid 12 to be small and viscosity change of the substrate processing liquid 12 with time to be suppressed.

FIG. 3 is a table for explaining concentration change of the substrate processing liquid 13 with time in the comparative example of the first embodiment.

The substrate processing liquid 13 of the comparative example was used in the substrate processing apparatus, and the components in the substrate processing liquid 13 were examined (1) immediately after the exchange of the substrate processing liquid 13, (2) after the circulation of the substrate processing liquid 13 for 24 hours, and (3) after the circulation of the substrate processing liquid 13 for 24 hours and the supplement of water to the substrate processing liquid 13.

As a result, it was apparent that the concentration of the acetic acid in the substrate processing liquid 13 decreased after the substrate processing liquid 13 was circulated for 24 hours. When the viscosity of the substrate processing liquid 13 at room temperature is estimated from the components in the substrate processing liquid 13, it is 18 cP immediately after the exchange of the substrate processing liquid 13, and it is 20 cP after the circulation of the substrate processing liquid 13 for 24 hours. In this manner, the circulation of the substrate processing liquid 13 causes the acetic acid to be evaporated from the substrate processing liquid 13 and the viscosity of the substrate processing liquid 13 to increase.

FIG. 4 is a table for explaining the substrate processing liquids 12 and 13 of the first embodiment and the comparative example thereof.

FIG. 4 presents four kinds of carboxylic acids for the substrate processing liquid 13 of the comparative example and six kinds of ketones for the substrate processing liquid 12 of the first embodiment. FIG. 4 presents the vapor pressures (20° C.), the viscosities (20° C.), the water solubilities and the boiling points of these carboxylic acids and ketones.

The viscosity of the ketone of the present embodiment is desirable to be lower than the viscosity of acetic acid. With the viscosity of acetic acid being 1.22 cP at 20° C. taken into consideration, the viscosity of the ketone of the present embodiment is desirable to be 1.0 cP or less at 20° C. All of the six kinds of ketones in FIG. 4 satisfy this condition and are liquid at 20° C. and 1 atm.

Moreover, the vapor pressure of the ketone of the present embodiment is desirable to be 30 mmHg or less at 20° C. It is noted that 30 mmHg corresponds to 4 kPa. In FIG. 4, four kinds of ketones satisfy this condition. The vapor pressure of the ketone of the present embodiment is desirable to be approximately the same as the vapor pressure of acetic acid or to be lower than the vapor pressure of acetic acid.

Figure 5:
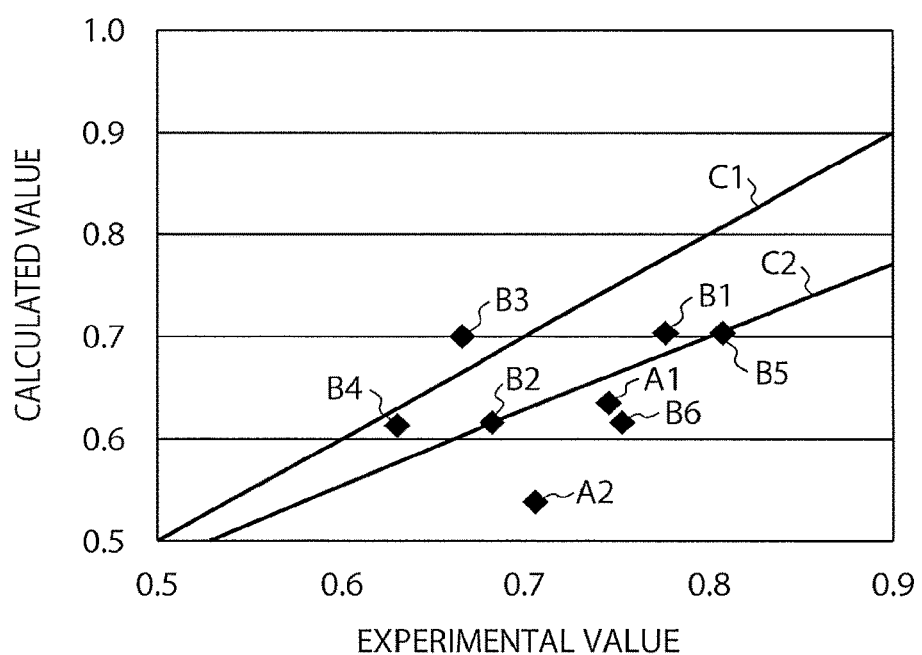
FIG. 5 is a graph for explaining the viscosity of the substrate processing liquid of the first embodiment.

FIG. 5 is a graph for explaining the viscosity of the substrate processing liquid 12 of the first embodiment.

The horizontal axis in FIG. 5 represents experimental values of the viscosity of the substrate processing liquid 12. The vertical axis in FIG. 5 represents calculated values of the viscosity of the substrate processing liquid 12. The values of the viscosity of the vertical axis and the horizontal axis denote relative viscosity. According to the estimation method of Arrhenius, the viscosity "μ" of the substrate processing liquid 12 is obtained from the following expression (2), $$\log \mu = (1-z_i)\log \mu_1 + z_2 \log \mu_2 \quad (2)$$

where "$\mu_1$" denotes the viscosity of phosphoric acid, and "$z_1$" denotes a mixing ratio of the phosphoric acid. Moreover, "$\mu_2$" denotes the viscosity of ketone, and "$z_2$" denotes a mixing ratio of the ketone. The expression (2) can also be applied to the substrate processing liquid 13 of the comparative example of the first embodiment when "ketone" is replaced by "carboxylic acid".

Point A1 represents the viscosity of the substrate processing liquid 13 containing acetic acid at 12.1 wt % of concentration. The experimental value at point A1 is approximately 0.7. The calculated value at point A1 is approximately 0.6.

Point A2 represents the viscosity of the substrate processing liquid 13 containing acetic acid at 16.4 wt % of concentration. The experimental value at point A2 is approximately 0.7. The calculated value at point A2 is approximately 0.5.

Point B1 represents the viscosity of the substrate processing liquid 12 containing 2-butanone (methyl ethyl ketone) at 9.4 wt % of concentration. The experimental value at point B1 is approximately 0.8. The calculated value at point B1 is approximately 0.7.

Point B2 represents the viscosity of the substrate processing liquid 12 containing 2-butanone (methyl ethyl ketone) at 12.9 wt % of concentration. The experimental value at point B2 is approximately 0.7. The calculated value at point B2 is approximately 0.6.

Point B3 represents the viscosity of the substrate processing liquid 12 containing 3-pentanone (diethyl ketone) at 9.5 wt % of concentration. The experimental value at point B3 is approximately 0.7. The calculated value at point B3 is approximately 0.7.

Point B4 represents the viscosity of the substrate processing liquid 12 containing 3-pentanone (diethyl ketone) at 13.0 wt % of concentration. The experimental value at point B4 is approximately 0.6. The calculated value at point B4 is approximately 0.6.

Point B5 represents the viscosity of the substrate processing liquid 12 containing 4-methyl-2-pentanone (methyl isobutyl ketone) at 9.3 wt % of concentration. The experimental value at point B5 is approximately 0.8. The calculated value at point B5 is approximately 0.7.

Point B6 represents the viscosity of the substrate processing liquid 12 containing 4-methyl-2-pentanone (methyl isobutyl ketone) at 12.8 wt % of concentration. The experimental value at point B6 is approximately 0.8. The calculated value at point B6 is approximately 0.6.

Regarding the viscosity of a substrate processing liquid that contains phosphoric acid and does not contain ketone and carboxylic acid, the experimental value is 1.0 and the calculated value is 1.0.

Sign C1 designates a straight line drawn under the condition that the experimental value is equal to the calculated value. Sign C2 designates a straight line drawn with the eight points in FIG. 5 averaged. It is apparent from the results that the calculated values based on the estimation method of Arrhenius well coincide with the experimental values. Moreover, it is apparent from comparisons of points B1 and B2, points B3 and B4 and points B5 and B6 that the viscosity of the substrate processing liquid 12 can be reduced by adding ketone in the substrate processing liquid 12.

FIG. 6 is a table for explaining the ketone in the substrate processing liquid 12 of the first embodiment.

A kind of a first hydrocarbon group R1 of the ketone is presented in the vertical direction in FIG. 6. A kind of a second hydrocarbon group R2 of the ketone is presented in the horizontal direction in FIG. 6. A methyl group, an ethyl group, a propyl group, a butyl group and a pentyl group contain one to five carbon atoms, respectively. For example, methyl ethyl ketone has a methyl group that contains one carbon atom, an ethyl group that contains two carbon atoms, and a CO group that contains one carbon atom. The number of carbon atoms per molecule of methyl ethyl ketone is four.

The ketone of the present embodiment is desirable to be liquid at 20° C., to have the vapor pressure of 4 kPa (30 mmHg) or less at 20° C., and to have the viscosity of 1.0 cP or less at 20° C. In FIG. 6, the kinds of ketones that satisfy these conditions are diethyl ketone, methyl propyl ketone, dipropyl ketone and the like. Moreover, with the kinds of ketones that are determined to satisfy these conditions taken into consideration, also the kinds of ketones that are enclosed by thick lines in FIG. 6 are predicted to satisfy these conditions. In the present embodiment, these kinds of ketones are desirable to be used.

Here, the ketone of the present embodiment is discussed in view of the number "N" of carbon atoms per molecule of the ketone. As understood from FIG. 6, the number "N" of carbon atoms of the present embodiment is desirable to be 5 or more. The reason is that the vapor pressure of the ketone tends to become higher as the number "N" of carbon atoms thereof becomes less. Moreover, the number "N" of carbon atoms of the present embodiment is desirable to be 11 or less. The reason is that the ketone becomes less soluble in water as the number "N" of carbon atoms becomes 12 or more. Therefore, FIG. 6 presents only the ketones with the number "N" of carbon atoms being 11 or less.

Figure 7A:
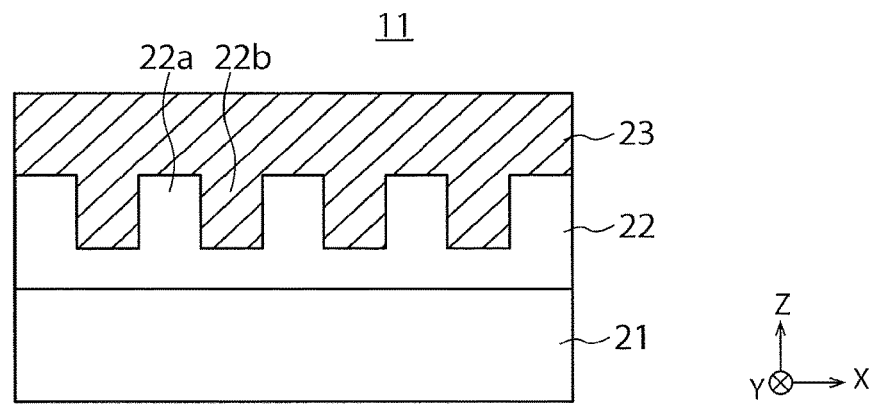
FIGS. 7A and 7B are cross-sectional views for explaining an example of a substrate processing method of the first embodiment.
Figure 7B:
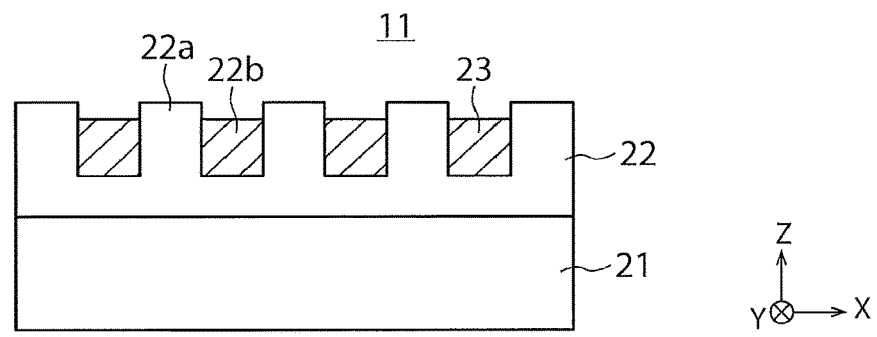

FIGS. 7A and 7B are cross-sectional views for explaining an example of a substrate processing method of the first embodiment. In the description of the present method, the direction perpendicular to the surface of the substrate 11 is configured as the Z-direction for convenience of explanation.

FIG. 7A illustrates the substrate 11 that is before processed by the substrate processing apparatus in FIG. 1. This substrate 11 includes a semiconductor substrate 21, a ground layer 22 provided on the semiconductor substrate 21, and a conductive layer 23 provided on the ground layer 22.

An example of the semiconductor substrate 21 is a silicon substrate. A surface of the semiconductor substrate 21 is provided, for example, with transistors. The ground layer 22 includes various inter layer dielectrics, line layers, plug layers and the like. Convex portions 22a separated from one another by one or more concave portions 22b are provided on a surface of the ground layer 22. The conductive layer 23 is formed such that the concave portions 22b are completely filled with the conductive layer 23. An example of the conductive layer 23 is a metal layer.

FIG. 7B illustrates the substrate 11 that is after processed by the substrate processing apparatus in FIG. 1. In the present embodiment, the conductive layer 23 is etched back by processing the substrate 11 with the substrate processing liquid 12. As a result, the conductive layer 23 is left only in the concave portions 22b, and the conductive layer 23 that has a desired shape is formed. This conductive layer 23 is used, for example, for interconnects.

Thereafter, various inter layer dielectrics, interconnect layers, plug layers and the like are formed on the substrate 11. In this way, a semiconductor device is manufactured from the substrate 11.

As described above, the substrate 11 in the present embodiment is processed with the substrate processing liquid 12 that contains phosphoric acid, water and a predetermined viscosity adjusting agent. An example of the viscosity adjusting agent of the present embodiment is ketone. Moreover, the viscosity adjusting agent of the present embodiment is liquid at 20° C., has vapor pressure of 30 mmHg or less at 20° C. and has viscosity of 1.0 cP or less at 20° C., for example. Therefore, the present embodiment makes it possible to reduce the viscosity of the substrate processing liquid 12 and to suppress viscosity change of the substrate processing liquid 12 with time.

While certain embodiments have been described, these embodiments have been presented by way of example only, and are not intended to limit the scope of the inventions. Indeed, the novel apparatuses, methods and liquids described herein may be embodied in a variety of other forms; furthermore, various omissions, substitutions and changes in the form of the apparatuses, methods and liquids described herein may be made without departing from the spirit of the inventions. The accompanying claims and their equivalents are intended to cover such forms or modifications as would fall within the scope and spirit of the inventions.

The invention claimed is:

1. A substrate processing method comprising:
   processing a substrate in a substrate processing bath by wet etching with a substrate processing liquid comprising phosphoric acid, water, ketone, and an oxidizing agent. wherein the ketone is liquid at 20° C., has vapor pressure of 30 mmHg or less at 20° C., and has viscosity of 1.0 cP or less at 20° C.;
   discharging the substrate processing liquid from the substrate processing bath to a circulating flow channel, heating the substrate processing liquid flowing through the circulating flow channel at a temperature between 50° C. and 90° C., and supplying the substrate processing liquid again from the circulating flow channel to the substrate processing bath to circulate the substrate processing liquid under heating; and
   purifying the heated substrate processing liquid with a filter in a purifying module provided on the circulating flow channel, wherein
   a concentration of the phosphoric acid in the substrate processing liquid is 50 to 95 wt %,
   a concentration of the water in the substrate processing liquid is 4 to 49.5 wt %,
   a concentration of the ketone in the substrate processing liquid is 0.5 to 15 wt %, and
   a concentration of the oxidizing agent in the substrate processing liquid is 0.1 to 10 wt %.

2. The method of claim 1, wherein the ketone is selected from diethyl ketone, methyl propyl ketone, and dipropyl ketone.

3. The method of claim 1, wherein the oxidizing agent comprises at least one of hydrogen peroxide having a concentration of 0.1 to 10 wt % in the substrate processing liquid and ozone having a concentration of 0.1 to 10 wt % in the substrate processing liquid.

4. A substrate processing apparatus comprising:
   a substrate processing bath configured to process a substrate by wet etching with a substrate processing liquid comprising phosphoric acid, water, ketone, and an oxidizing agent, wherein the ketone is liquid at 20° C., has vapor pressure of 30 mmHg or less at 20° C., and has viscosity of 1.0 cP or less at 20° C.;
   a circulating flow channel configured to circulate the substrate processing liquid by supplying the substrate processing liquid discharged from the substrate processing bath again to the substrate processing bath;
   a heater configured to heat the substrate processing liquid flowing through the circulating flow channel; and
   a purifying module configured to purify, with a. filter, the substrate processing liquid that flows through the circulating flow channel and is heated by the heater, wherein
   a concentration of the phosphoric acid in the substrate processing liquid is 50 to 95 wt %,
   a concentration of the water in the substrate processing liquid is 4 to 49 5 wt %,
   a concentration of the ketone in the substrate processing liquid is 0.5 to 15 wt %, and
   a concentration of the oxidizing agent in the substrate processing liquid is 0.1 to 10 wt %.

5. The apparatus of claim 4, wherein the oxidizing agent comprises at least one of hydrogen peroxide having a concentration of 0.1 to 10 wt % in the substrate processing liquid and ozone having a concentration of 0.1 to 10 wt % in the substrate processing liquid.

6. The apparatus of claim 4, wherein the substrate processing liquid is contained in the substrate processing bath.

7. The apparatus of claim 6, wherein the oxidizing agent comprises at least one of hydrogen peroxide having a concentration of 0.1 to 10 wt % in the substrate processing liquid and ozone having a concentration of 0.1 to 10 wt % in the substrate processing liquid.

* * * * *